(12) United States Patent
Law et al.

(10) Patent No.: US 7,919,792 B2
(45) Date of Patent: Apr. 5, 2011

(54) STANDARD CELL ARCHITECTURE AND METHODS WITH VARIABLE DESIGN RULES

(75) Inventors: Oscar M. K. Law, Hsin-Chu (TW); Manoj Achyutrao Joshi, Boushan Township (TW); Kong-Beng Thei, Hsin-Chu (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 279 days.

(21) Appl. No.: 12/338,632

(22) Filed: Dec. 18, 2008

(65) Prior Publication Data

US 2010/0155783 A1 Jun. 24, 2010

(51) Int. Cl.
H01L 27/10 (2006.01)
H01L 29/76 (2006.01)
H01L 29/94 (2006.01)
H01L 31/062 (2006.01)
H01L 31/113 (2006.01)

(52) U.S. Cl. ......... 257/206; 257/209; 257/202; 257/390

(58) Field of Classification Search .................. 257/206, 257/209, 202, 208, 211, 390, 315, 328, 296, 257/393, 368
See application file for complete search history.

(56) References Cited

U.S. PATENT DOCUMENTS

| 5,268,319 A | * | 12/1993 | Harari ........................... 438/260 |
| 5,279,982 A | * | 1/1994 | Crotti ............................ 438/586 |
| 6,483,136 B1 | * | 11/2002 | Yoshida et al. ................ 257/295 |
| 6,483,749 B1 | * | 11/2002 | Choi et al. ................ 365/185.18 |
| 7,423,310 B2 | * | 9/2008 | Verhoeven ..................... 257/308 |
| 2003/0218920 A1 | * | 11/2003 | Harari ........................... 365/200 |

OTHER PUBLICATIONS

Smith, M.J.S.; "Application-Specific Integrated Circuits"; Addison-Wesley VLSI Systems Series; Addison-Wesley Professional, (Jun. 20, 1997); Preface and Chapters 3.4-3.7, 5.1-5.4, 16, and 17; 74 pages. Also available at http://www.edacafe.com/books/ASIC/Book/.

* cited by examiner

Primary Examiner — Chuong A. Luu
(74) Attorney, Agent, or Firm — Slater & Matsil, L.L.P.

(57) ABSTRACT

Structures and methods for standard cell layouts having variable rules for spacing of layers to cell boundaries are disclosed. In one embodiment, a first standard cell layout is provided with a conductive layer having at least two portions spaced apart by a minimum spacing distance, the conductive layer having at least one portion spaced from a cell boundary by a first spacing distance of less than half of the minimum spacing distance; a second standard cell disposed adjacent the first standard cell with at least one second portion of the conductive layer in the second cell disposed adjacent the first portion in the first standard cell and spaced apart from a common cell boundary by a second spacing greater than half of the minimum; wherein the sum of the first and second spacings is at least as great as the minimum spacing. A method for forming standard is disclosed.

15 Claims, 8 Drawing Sheets

| simulation of an invertor performance in Fig.7 | Rise Time (ps) | Fall Time (ps) | Frequency (GHz) | Frequency (%) | Power | Power (%) |
|---|---|---|---|---|---|---|
| Original Layout | 21.11 | 18.56 | 1.675 | | 4.5485 | |
| Original Layout with 60% contact | 19.2 | 17.44 | 1.785 | 6.57% | 4.5485 | 0.00% |
| Novel Layout with 60% contact | 18.91 | 16.48 | 1.835 | 9.55% | 4.1142 | -9.55% |

Fig. 8

STANDARD CELL ARCHITECTURE AND METHODS WITH VARIABLE DESIGN RULES

TECHNICAL FIELD

The present invention relates to a circuit and methods for providing an improved integrated circuit design and methods using a cell based approach with variable spacing rules to improve the tolerance of a completed integrated circuit to process variations. The invention provides advantages especially at advanced semiconductor process technology nodes having minimum feature sizes of 32 nanometers, and less.

BACKGROUND

Presently, system level designers who determine a need for a newly defined integrated circuit, for example to integrate a variety of functions into one chip, often use an application specific integrated circuit (ASIC) or system on a chip (SOC) cell based design. In this approach, a library of known functions is provided, and after the functional design of the device is specified by choosing and connecting these standard functions, and proper operation of the resulting circuit is verified using electronic design automation (EDA) tools, the library elements are mapped on to predefined layout cells which contain prefigured elements such as transistors. The cells are chosen with the particular semiconductor process features and parameters in mind and create a process parameterized physical representation of the design. The design flow continues from that point by performing placement and routing of the local and global connections needed to form the completed design using the standard cells. Eventually, after design rule checks, design rule verification, timing analysis, critical path analysis, static and dynamic power analysis, and final modifications to the design, a "tape out" step is formed to produce photomask generation data. This photomask generation data (PG) is then used to create the optical masks used to fabricate the semiconductor device in a photolithographic process at a wafer fabrication facility.

As semiconductor processes advance, device sizes continue to decrease. Present semiconductor production includes 45 nanometer and soon 32 nanometer minimum feature sizes. These process milestones are usually referred to as "technology nodes". Advances towards 28 nanometer node mass production are underway and expected shortly. The trend to smaller devices and more advanced nodes will no doubt continue.

As the transistor sizes shrink commensurate with the advances in the technology nodes, the device characteristics and performance become dominated by physical layout effects. The devices also exhibit wide performance differences due to semiconductor process variations. Robust designs must anticipate these effects.

In order to control the device process variation sensitivity, semiconductor manufacturers may use a restricted design rule approach ("RDR"). By restricting where certain layers can be formed with respect to the cell boundaries and with respect to the other layers, the process variation sensitivity problem can be reduced. However, this approach produces additional disadvantages. If horizontal polysilicon routing is not available to the routing process, for example, a layer of metal, typically metal layer 2 must be used to connect internal devices together to form a simple function within a cell. This known prior art approach increases the parasitic coupling significantly, thereby slowing down circuit performance. Generally, an area penalty is created when RDR approaches are used. The amount of silicon needed to implement the cells increases as the design rules are restricted.

This additional metal 2 routing within the cells also adversely uses most of the available metal 2 connectivity resource. Also, because the base cells now include metal 2, a routing congestion problem can happen when trying to route intercell connection signals, or power, clock or ground signals, over the cells. The result is a larger (less dense) layout requiring additional silicon area, or requiring the use of additional metal layers to resolve the congestion problems. These solutions to congestion in the cells add to manufacturing costs.

FIG. 1 depicts a very simple plan view of a cell layout with metal spacing rules for a pair of standard cells shown disposed in an ASIC or SOC design 10 that may be obtained using current cell based design approaches. In FIG. 1, only the cell boundaries for the standard cells 11 and layer boundaries 12 are shown. The layer boundaries indicate the area within the standard cell where a conductive layer can be formed. The layer to layer spacing rule for this example is "a", which is a minimum distance. For example, "a" might be 5 nanometers. In order to ensure that for any placed cells that neighbor another placed cell, the full layer to layer spacing distance "a" is maintained, the cells 11 in this prior art approach are configured so that no portion of the layer is placed outside the area of the layer boundaries 12. Thus, as shown in FIG. 1, when two such cells are packed together as neighbors, a spacing "a" is always maintained. Typically, the conductor layer will be formed of aluminum and its alloys or copper and its alloys, but other conductive layers that are isolated by dielectric may be used. Doped polysilicon is one alternative.

FIG. 2 is a second plan view that further illustrates how two cells are placed with a minimum layer to layer spacing rule "a" in the prior art. Again, the figure illustrates in a very simple plan view two neighboring standard cells 11. Each has two instances of a typical layer 13, for example the layer may be metal 1, which may be formed of aluminum or copper, or it may represent a conductor layer such as polysilicon which may also have a silicided layer as is known in the art. The layers 13 are subject to the minimum spacing rule. The layers 13 are therefore placed so that they are not closer than a distance of a/2 from the boundary of the cell. The cells are a uniform width B which also determines a pitch for the cells. The neighboring cells then cannot be arranged so that the layers 13 (in this example embodiment) are closer than a distance "a" from one to another.

In advanced semiconductor processing, the use of RDRs to improve the yield of the manufactured devices is known. One RDR restriction that may be used at the 32 nanometer node, and probably at smaller technology nodes in the future, is that polysilicon, the lowest conductor layer in the IC fabrication, will be restricted to be placed in a unitary direction. That is, all of the polysilicon conductors may be required to be parallel to one another and running in only the vertical, or only the horizontal, direction. Also, the polysilicon layer may be further restricted to be of a uniform width and pitch. These restrictions insure more uniform results over process variations, that is, the devices manufactured with these restricted layout rules will have less process sensitivity.

However, these restrictions also make connecting library functions in a typical standard cell difficult. FIG. 3 depicts, as a non-limiting and very simple example, a two input NAND gate that may be found in a typical design library as used in IC design and particularly in ASIC design. In FIG. 3, it can be seen from examining the circuit that when both the inputs B and A are at a logical high level, a "1", both N type transistors N1 and N2 will become conducting. At the same time, both P type transistors P1 and P2 will be non-conducting. Output Y will be coupled to ground, or the supply labeled Vss, and will be a logical "0". In case either of the inputs B and A are at a logical low level, the path through N2 and N1 will be broken and at least one of the P type transistors will be active. Accordingly, output Y will be coupled to the positive supply of VDD and will be a logical "1" or high level.

As is known in the art, a CMOS standard cell can be formed containing four or more transistors with the P and N gates coupled together to form common elements (CMOS inverters) that may be further coupled using local interconnections to form a wide variety of library elements. This cell layout is then replicated in a cell array and may form a large part of, or all of, a device for implementing the functions specified by a designer using a circuit standard cell library and using known design and verification tools. More complex functions such as ALUs, register files, FIFOs, latches, multipliers, adders, multiplexers, switches and so forth may also be formed by using a plurality of the standard cells coupled together by multiple levels of interconnect. By using known elements that are mapped onto the standard cells in advance, a robust design methodology is produced, the designer does not have to verify that the circuits in the cell library function correctly at the transistor level, as that work was done in advance. Instead, only the functional operation of the interconnected elements has to be verified. Skilled circuit designers with expertise in transistor and device design have already verified that the circuits in the library will work and models of the devices are provided to the tools including drive strengths, delays, and so on, so that the designer of a new ASIC does not have to reinvent transistor, logic or even register level circuitry every time a new device is created.

Further, most ASICs manufactured today may include, in addition to the cells, a plurality of embedded functions. These may include, for example, a microprocessor, RISC processor, analog to digital converter, radio transceiver such as for a mobile telephone or wireless device, or other known function such as a memory module, incorporated with a plurality of user defined logical functions.

The two input NAND gate 30 of FIG. 3 has inputs A and B coupled to a respective pair of CMOS transistors P1 and N1, for input A, and P2 and N2, for input B. Output Y is coupled to the current conduction paths of both P1 and P2, and also to the series current conduction path of the n type transistors N1 and N2. So output Y has three connections inside the NAND gate, while inputs A and B each have 2 connections. Inputs A and B are coupled to gate terminals. Output Y is coupled to the drains of P type transistors P1 and P2, and to the source of transistor N2. Transistor N1 has a current conduction path coupled to ground. Transistors N1 and N2 form a series path to VSS or ground when the two inputs are both high.

FIG. 4 depicts, in a plan view, the layout patterns for two adjacent standard cells 42 and 44 in a layout for a portion of an integrated circuit 40. Each of these two cells has width B. Each cell is connected to form a two input NAND logic gate as shown in FIG. 3. In an actual device, many more standard cells, hundreds, thousands or more of these cells will be placed to implement the circuitry of the integrated circuit.

The standard cells are formed, in this illustrative example, on a P type semiconductor substrate, or alternatively, for silicon-on-insulator ("SOI"), it could be on an epitaxial layer of doped or undoped semiconductor material. P and N type active areas 46 and 26 are formed at the top and bottom of the cells 42 and 44 as shown, respectively. The P type active areas 46 are typically formed in an N type well, using a double diffused process, ion implantation, thermal anneals, and like semiconductor processing steps as are known in the art. The active areas or "oxide dimensioned" (OD) areas 46 and 26 are defined by isolation oxide regions. The isolation regions are also not visible but typically shallow trench isolation (STI) or LOCOS oxidation is used to isolate the active areas one from another. In the standard cell layout of FIG. 4, the active areas take an L shape, although the "L" is not visible in this illustration. This L shape produces some asymmetry or imbalances in the performance of the cell which will be detailed later.

Unidirectional polysilicon (PO) and gate oxide regions 22 and 24 are formed. These include dummy polysilicon vertical lines such as 43 and 41 which do not overlie any active area but form the cell boundary regions. Dummy vertical PO lines may be used for interconnection to form other circuits within the cell. PO lines 22 and 24 are deposited in the usual MOS processing steps of oxide deposition, polysilicon deposition, etch, sidewall formation before or active source and drain diffusion implantation, thermal anneal, etc as are known in the art. Thus, the polysilicon lines 22 and 24 form MOS transistor gates and lie over a gate dielectric (not visible) which may be, for example, an oxide or nitride or oxynitride that forms the gate dielectric. Other high k and low k oxides may be used.

Using conventional processing, source and drain diffused regions (labeled "s" and "d") are formed adjacent the polysilicon gates. For the P channel transistors P1 and P2 as shown in the figure, P type doping is performed. Typically, a self aligned process is used, that is, the gate polysilicon is used as an alignment mask for these source/drain diffusion steps. Alternative processes are known. Implant, diffusion, anneals and silicide steps may be used as are known in the art. For transistors N1 and N2 as shown in the figure, N-type dopants are used to form source and drain regions on either side of the polysilicon gates.

After an interleaved insulating layer is deposited to prevent electrical shorts between layers, a conductor such as metal 1 is deposited and patterned to connect some of the circuit elements. Vias through these insulating layers may be used to couple the conductor layer metal 1 to the underlying polysilicon PO layers, which are either gate conductors for transistors N1, P1, N2, P2, or dummy polysilicon lines. In FIG. 4, metal 1 portion 34 is coupled to terminal B for connecting one input of the 2 input NAND gate to external circuits, to gates of transistors P2 and N2. Pin A, another input, is coupled by metal portion 32 to the polysilicon gate 22 which forms the gate terminal of transistors P1 and N1. Reference to FIG. 3 will show how this input is coupled to the gate of a P and an N type transistor, which together form one inverter in CMOS logic. Contacts couple conductors to the source and drain diffused regions.

Other connections are also made by the layout of FIG. 4, to complete the NAND gate logic as shown in FIG. 3. Metal 1 bus 28 couples a voltage supply Vss, or ground, to the source of transistor N1. Transistors N1 and N2 share a diffusion region that forms the drain of N1 and the source of N2. Transistor N2 has a drain region that is coupled by a contact to the metal 2 layer for the Y terminal.

Similarly, the metal 1 buss 53 forms a VDD terminal. Buss 53 is coupled horizontally across the ends of the polysilicon PO regions and forms the top of the standard cells. metal 1 is also used to couple VDD to the common drain region for transistors P1 and P2, which is in the center portion between the polysilicon gates in diffusion 46. Sources 's' for transistors P1 and P2 are coupled together by a metal 1 portion 48 through the use of contacts, and to the vertical metal 2 portion 36 to form the Y terminal.

Referring to FIG. 3, it can be seen that the output terminal Y in FIG. 3 is to be coupled to the drain regions of transistors P1 and P2 and the source region of N2

The layout of the two cells in FIG. 4 illustrates some of the disadvantages of the layer to layer, and layer to cell boundary spacing rules of the prior art. Cell boundary 41, for example, is shown and additional cell boundaries are shown in vertical alignment with and running through the dummy polysilicon portions.

In FIG. 4, the use of metal 2 portions is necessary to couple the two input NAND gate elements to complete the logic gate connections in the standard cells 42 and 44. This is so because the pin A and the output pin Y, and connections for Y cannot be routed in metal 1, as there is not sufficient space to place a vertical metal 1 line that meets the "a/2" spacing to the cell boundary. Similarly, input pin A cannot be formed in metal 1, due to the design rule requirement that metal 1 be no closer than a/2 to the cell boundary and must be spaced at least distance "a" from other metal 1 layers. This distance is shown in the figure. Therefore, these connections are necessarily completed using metal 2, such as 36. This implementation disadvantageously increases the parasitic RC load on the layer metal 2, increases routing congestion (by making metal 2 routing for interconnect go around the standard cell areas) and uses up some of the available metal 2 resources, resulting in either the need for additional metal layers and the associated processing costs, or larger silicon area overall to complete the device.

Thus, there is a continuing need for improved methods and layout structures to address these and other problems with the standard cells of the prior art as used in advanced semiconductor processes.

SUMMARY OF THE INVENTION

These and other problems are generally solved or circumvented, and technical advantages are generally achieved, by embodiments of the present invention, which provides a restricted design rule with variable layer to cell boundary spacing distance rules, so that for any two neighboring standard cells, the distance from layer to layer is maintained at least a required minimum, while the layer to boundary distance for the cells is a variable distance that may be less than half of the first minimum distance.

In a first exemplary embodiment of the invention, a standard cell with variable layer to cell boundary restricted design rules is disclosed. In the standard cell, a layer is defined that has a minimum layer to layer spacing distance. In adjacent standard cells, the distance from the layer to the nearest cell boundary may be varied in one cell; however, the layer to cell boundary distance must also be varied in the adjacent cell to maintain the minimum layer to layer spacing across cells.

In yet another embodiment, a standard cell for use in implementing an integrated circuit is disclosed with polysilicon portions subjected to restricted design rules. In one restricted design rule, the polysilicon portions are unidirectional. In a second restricted design rule, the polysilicon portions are of uniform width and pitch. Dummy polysilicon portions form the vertical cell boundaries of the standard cell. A metal 1 layer is formed over the polysilicon having a layer to layer minimum distance spacing rule and a variable layer to cell boundary spacing rule. The metal 1 layer may extend over a portion of the dummy polysilicon near a cell boundary, so long as between adjacent standard cells, the layer to layer spacing rule is maintained.

In yet another exemplary embodiment, a plurality of standard cells is placed and connected to form an integrated circuit. The standard cells are subjected to restricted design rules. Polysilicon portions forming gates for transistors are placed in the cells. The polysilicon portions are of uniform width and extend in a uni-direction across a pair of active areas. The active areas comprise diffusions of opposite conductivity types to form the source and drain regions of MOS transistors, while the polysilicon forms the gates of the MOS transistors. Additional polysilicon portions are formed in the cells or along the cell boundaries that do not overlie active areas. Conductive layer portions are formed overlying the standard cells and having layer to layer spacing rules. A portion of the conductive layer may overlie the dummy polysilicon adjacent a cell boundary, while in an adjacent cell, the conductive layer is spaced apart from the cell boundary to maintain the layer to layer spacing at the minimum distance.

In a method embodiment, a layout tool is used to design standard cells using polygon graphical representations of the structural elements of the cell. A standard cell boundary region is defined. An active area is defined within the standard cell. Polysilicon gate conductors are arranged overlying the active area and forming conductors that are uni-directional and having a uniform pitch between them and are of uniform width. Dummy gate conductors of the same layer as the polysilicon gate conductors are arranged along the cell boundary and in the uni-direction and also having the uniform pitch and width. A conductor layer is formed in the cell area making connections. At least two portions of the conductor layer are formed having a minimum spacing distance between them. A second standard cell having a second active area, a second set of gate conductors of polysilicon is formed in the uni-direction and having uniform pitch and width. A dummy gate conductor is shared by the two cells along a common cell boundary. A layer of conductors is formed over the second cell area and having a minimum spacing distance from the layer of conductors in the first cell. The spacing from the conductors in the first cell to the cell boundary and the spacing from the conductors in the second cell to the cell boundary is variable, but the sum of the two spacings forms a layer to layer spacing distance not less than the minimum distance. In one method, a portion of the first layer overlies the dummy gate conductor at the common cell boundary.

The foregoing has outlined rather broadly the features and technical advantages of the present invention in order that the detailed description of the invention that follows may be better understood. This summary section briefly describes certain exemplary embodiments of the invention but the invention is not limited only to these exemplary embodiments.

Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 8 illustrates a table of simulation results comparing the prior art approach to embodiments of the invention.

The drawings, schematics and diagrams are illustrative, and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 5:
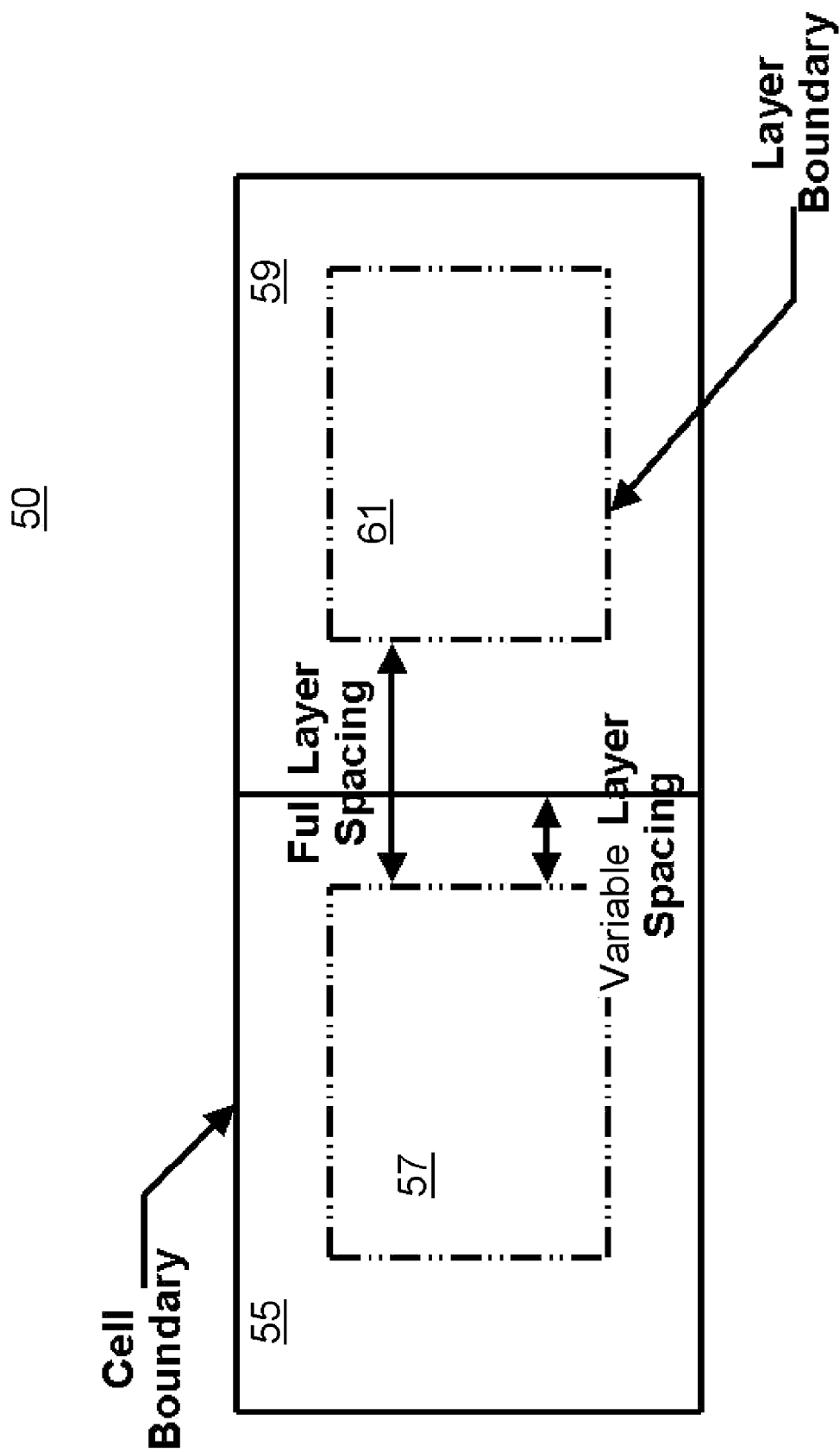
FIG. 5 illustrates a simplified plan view of a pair of standard cells, the cell boundaries, and the layer to layer spacing rules for an example embodiment of the present invention.

FIG. 5 depicts in a simple plan view a portion of an integrated circuit. For a non limiting example, the integrated circuit may be an ASIC 50 with two example standard cells 55 and 59 illustrated. This non-limiting example is used to depict the spacing rules of the exemplary embodiment. In FIG. 5, two standard cells 55 and 59 are shown placed adjacent one another. Cell 55 has a layer spacing boundary, for example metal 1 or another layer, bounding an area where the layer may be placed 57. Cell 59 has a layer spacing boundary bounding an area where the same layer may be placed 61. As shown in the figure, the layer spacing is not uniform with respect to the cell boundaries on all four sides of the layer area. This variable layer spacing changes the rules and methods for placing layers within the adjacent cells. While the full layer spacing from layer to layer, for example a minimum distance 'a', is maintained, the spacing from a layer boundary to the cell boundary is now allowed to be variable. In contrast to the prior art, the layer boundary to cell boundary spacing is no longer fixed at a simple, uniform spacing.

A relationship for the layer boundary to cell boundary distance, a variable distance, to the minimum layer to layer spacing distance 'a', may be stated as:

$$a' + a'' = a$$

wherein: $a' > a/2$.

Figure 6:
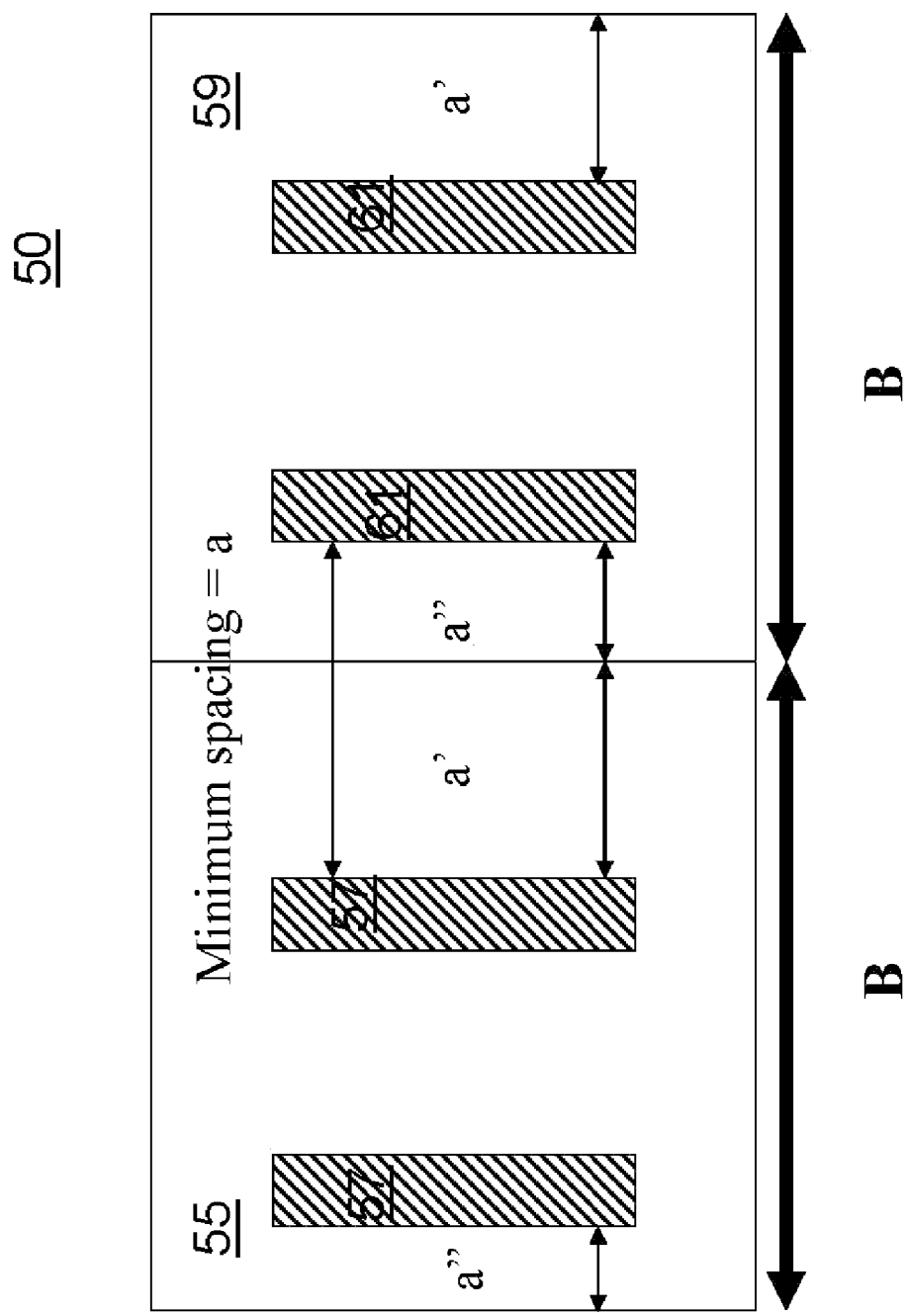
FIG. 6 illustrates another exemplary embodiment of the variable layer to cell boundary spacing rules of the present invention.

FIG. 6 further illustrates this relationship in an exemplary embodiment for a layer, such as a metal 1 layer, in adjacent standard cells. Since $a' > a/2$, it can be seen that $a''$ is therefore $< a/2$.

In FIG. 6, cells 55 and 59 are again placed adjacent one another with a common cell boundary in between them. A conductive patterned layer, such as metal 1, is shown forming conductors 57 and 61. The spacing from conductor 57 to the nearest cell boundary in cell 55 is a', which is a distance less than a. The spacing from the cell boundary in cell 59 to the patterned conductor 61 which is in the same layer is a''. The sum of a' and a'' are at least the minimum spacing 'a'. Note that the pattern repeats in the cell design, the spacing from patterned conductor which is the same layer, to the nearest cell boundary is a''. The spacing from patterned conductor, also of the same layer in cell 59 is a'. In this manner, additional cells 57 and 59 may be placed in an alternating fashion, to ensure the minimum spacing distance 'a' between conductors of this layer is maintained throughout the design.

Figure 7:
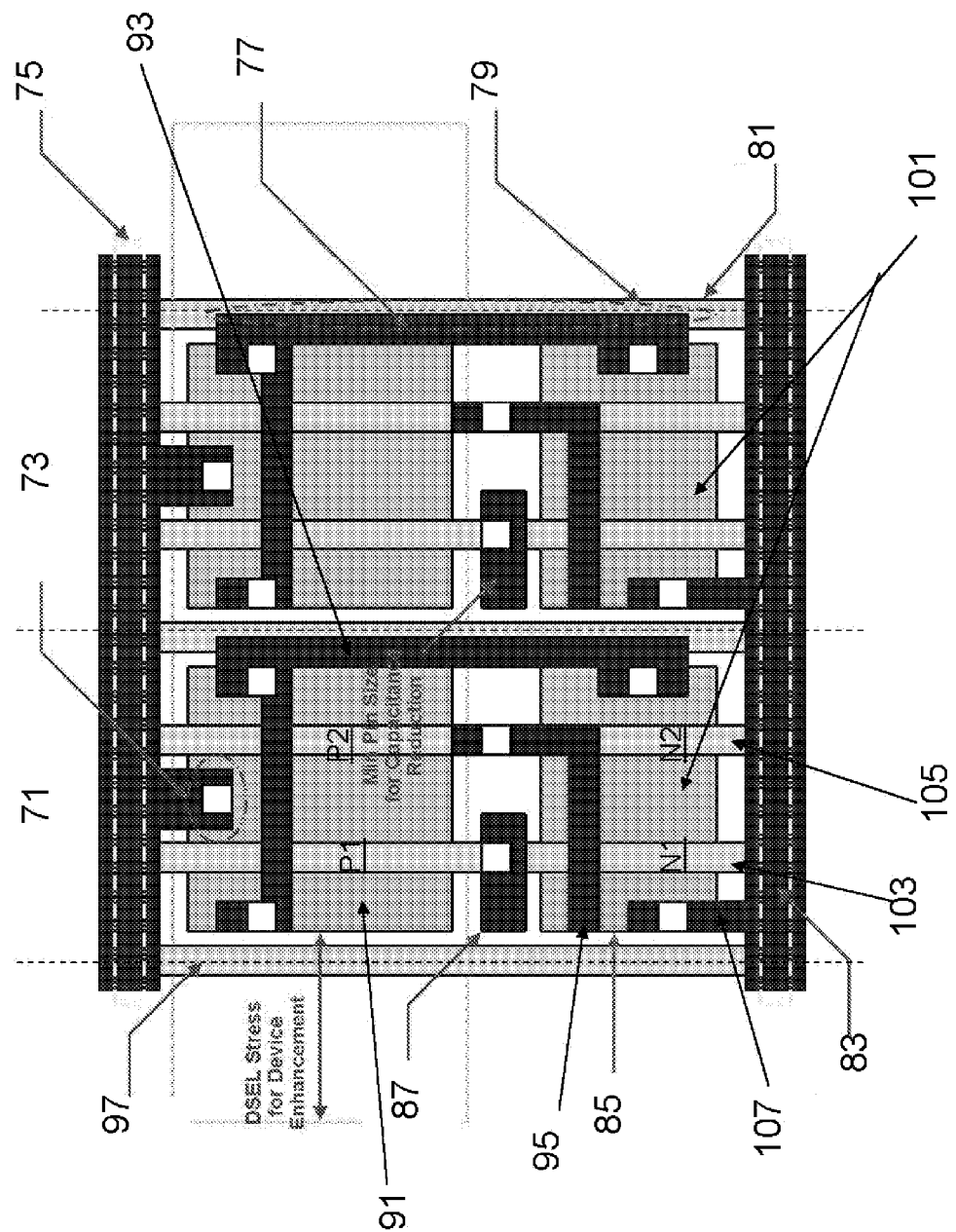
FIG. 7 illustrates in another exemplary embodiment a layout view of a pair of standard cells implementing the NAND gate of FIG. 3.

FIG. 7 depicts in an exemplary embodiment of the invention a pair of standard cells placed adjacent one to the other with a common cell boundary. In FIG. 7 several aspects of the present invention are shown and will be discussed.

Figure 1:
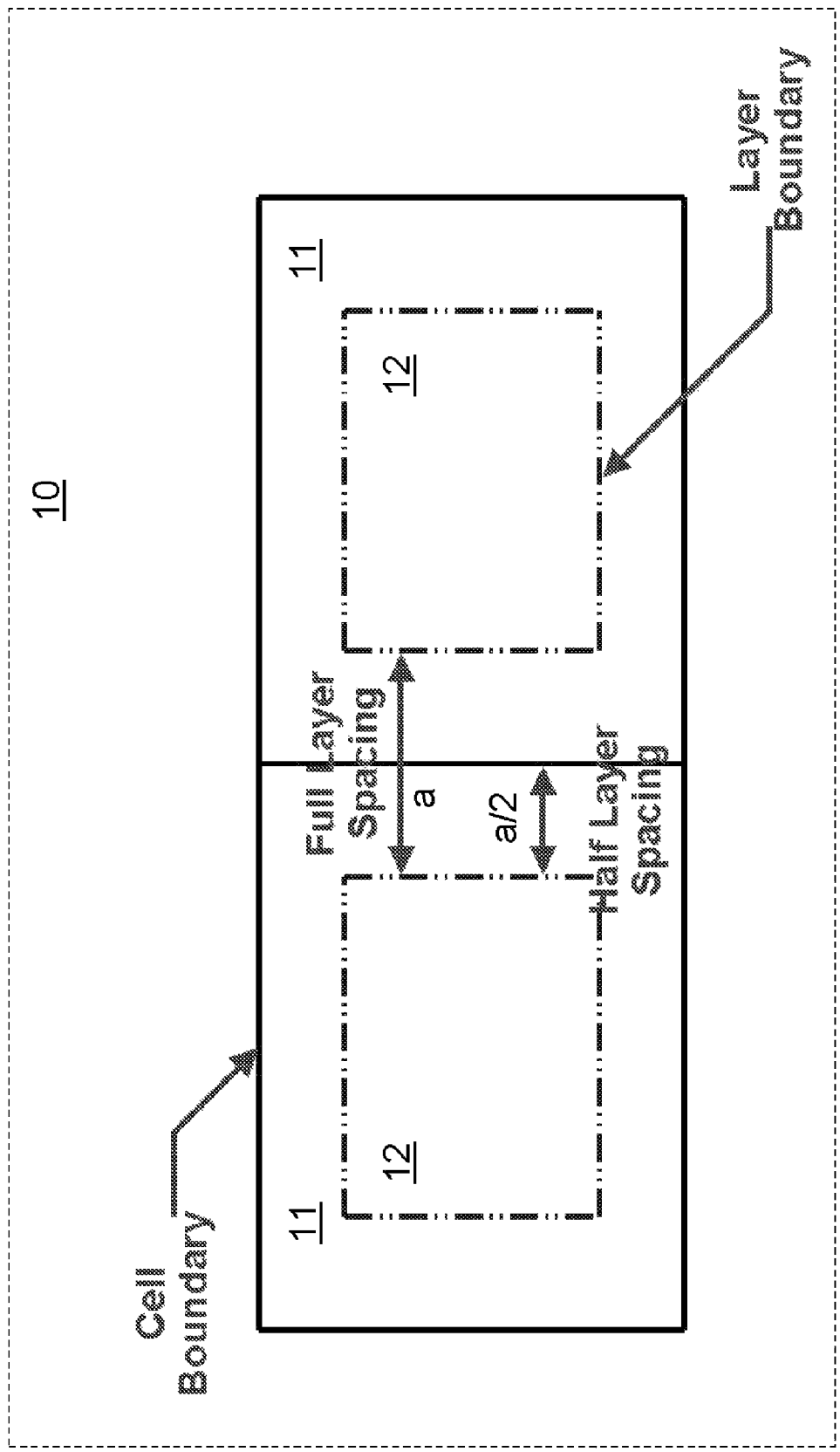
FIG. 1 illustrates a simplified plan view of a pair of prior art standard cells, the cell boundaries, and the layer to layer spacing rules for a conductor layer.
Figure 2:
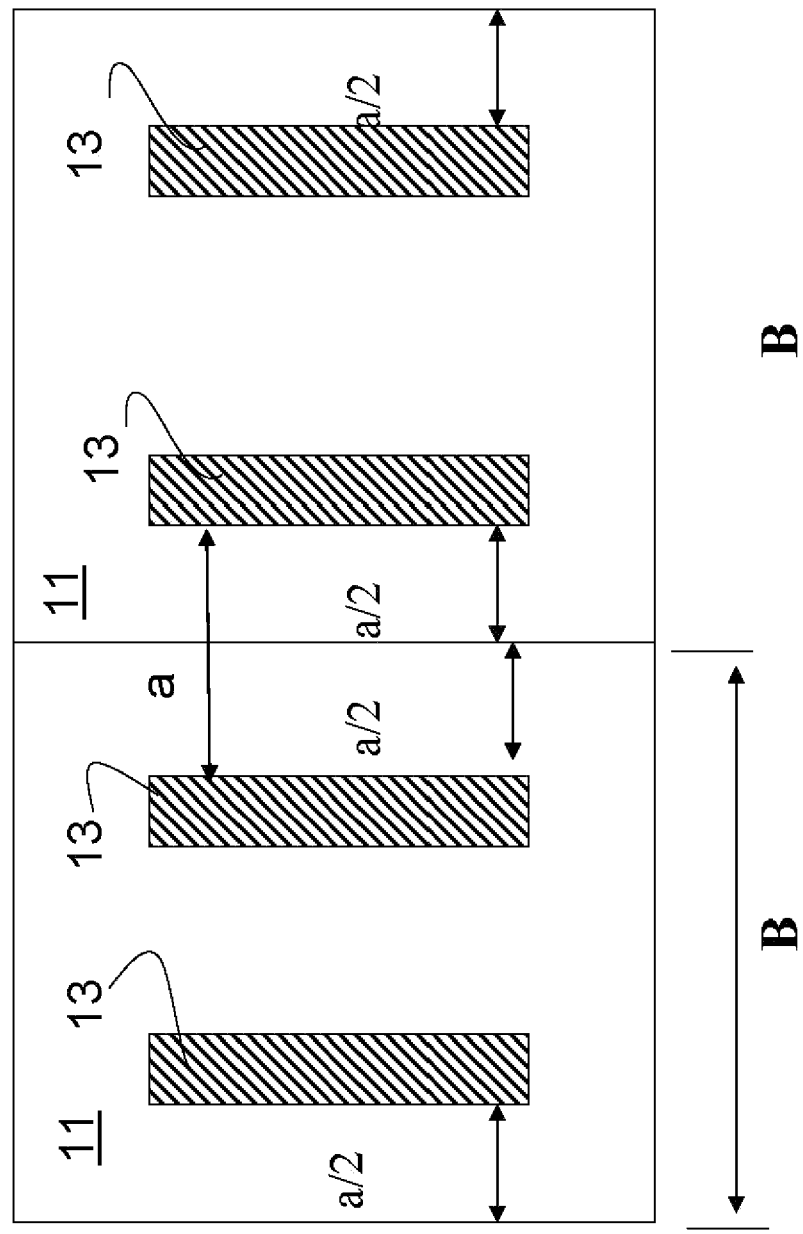
FIG. 2 illustrates in another view the prior art layer to layer spacing for two standard cells and a conductor layer.
Figure 3:
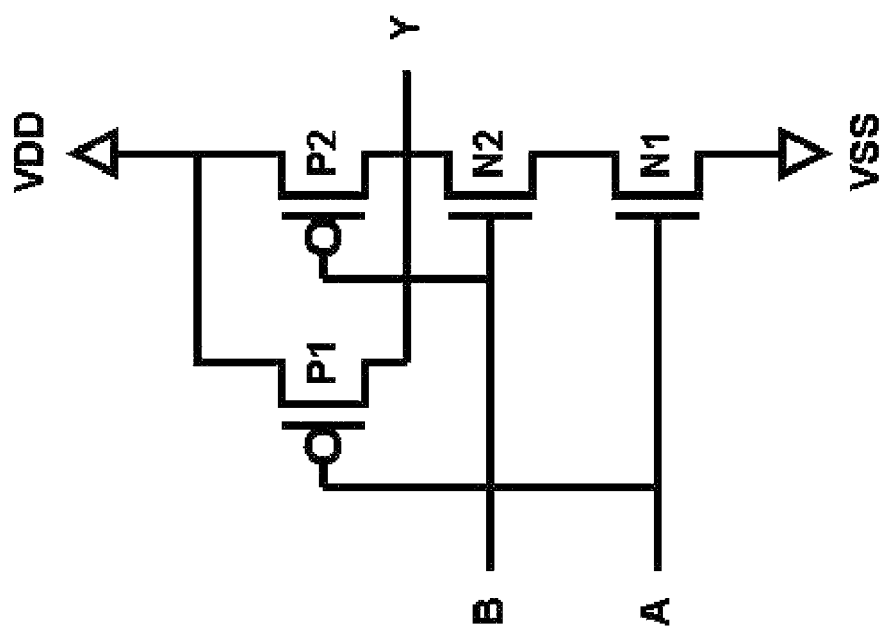
FIG. 3 illustrates in a simple circuit schematic a two input CMOS NAND gate of the prior art.

Again, for explanatory purposes, in FIG. 7, two adjacent standard cells 71 and 73 are depicted as layouts in a plan view. In an actual implementation in a practical integrated circuit or ASIC, many more cells, hundreds, thousands or more standard cells would typically be present. Again for explanatory purposes, the cells are configured by connections to implement the two input NAND function of FIG. 3. Other circuits using four or less transistors may be formed in a single cell, and circuits requiring more transistors may be formed using multiple cells connected together.

In FIG. 7, the diffusions 91 and 101 are P type diffusions for the P MOS transistors and N type diffusions for the N MOS transistors. As is typically done, the underlying substrate material is a P type substrate, thus for isolation the P transistor area at the top portion of the cells is also formed in an N type well, which is not shown for clarity. Further, isolation such as shallow trench isolation is used to perform electrical isolation between the n and p active areas, which are referred to as the OD areas.

Polysilicon conductors 81 are shown arranged in a uniform pitch, width and in one direction (uni-directional). The use of the uniform pitch and width of the polysilicon portions, and restricting the layout to a uni-direction in the polysilicon layer, has benefits in increasing the tolerance of the finished devices to process variations and critical dimension (CD) tolerance.

Polysilicon gates 103 and 105 extend over the active areas and form the P type transistors P1 and P2 and the N type transistors N1 and N2 in the corresponding active areas 91, for P type, and 101, for N type. In the embodiment of the invention of FIG. 7, the dummy polysilicon conductors such as 79 are placed at the cell boundaries. Cell boundary 97, for example, has dummy polysilicon conductor running along it.

Metal 1 is used to complete the logic circuit by coupling the source, drain and gate connections for the four transistors P1 and P2, and N1 and N2. Metal 1 portion 87 forms the input "A" of the NAND gate. Metal 1 portion 95 forms input B. These metal 1 layer portions are coupled to the polysilicon gates P1 and N1, and P2 and N2, respectively. The gate polysilicon conductors 103 and 105 are formed over gate dielectric, which may be oxide, nitride, or other high or low k dielectric material, and combinations thereof, which is then patterned to form a gate dielectric lying under the gate polysilicon conductors. Source and drain regions are formed on either side of the gate conductors using conventional ion implantation of donor atoms, or by using thermal anneal, or both. The source regions for transistors P1 and P2 are coupled together ("common source") and contact 73 couples them to a metal 1 end cap material that is coupled to Vdd. Contact 73 is oversized to improve routability for the cells and to relieve stress in the contact area.

The source of transistor N2 is coupled to the Y output by metal 1 portion 93. This metal 1 portion overlies a part of the dummy polysilicon portion that forms the cell boundary, so the distance from this metal 1 layer to the cell boundary is small, that is, distance a'. By allowing the Y connection to extend to the common cell boundary and overlap the dummy polysilicon, the two input NAND gates can now be connected using only metal 1 inside the standard cells. This embodiment of the invention advantageously frees the metal 2 layer used in the prior art cell for interconnect routing between cells, and thus greatly improves the routability of the cells, because metal 2 can now run over the cells.

The region between the gates for transistors N1 and N2 is the drain for transistor N2, and the source for transistor N1. These transistors are coupled in series between the Y output and the voltage Vss, supplied by horizontal metal 1 buss 83. The drain region of transistor N1 is then coupled, by a metal 1 portion 107 to a metal 1 buss 83, which will be coupled to a voltage supply Vss, or ground.

The metal 1 portions for the terminals A, B and Y, which are labeled 87, 95, and 93 in the figure, are widened beyond the minimal design rule requirements for making the connections. This feature increases the routability of the cell by extending the area available for vias to connect to upper layers of conductors.

The metal 1 layer of the standard cells may be formed, in another embodiment of the invention, using a "double cut" or two mask photolithographic process. As is known in the art, this extra step can improve the horizontal "end caps" 75 (for Vdd) and 83 (for Vss) in the cells, although it does require one additional mask step. Alternatively, this step may be omitted, and the metal 1 can be formed using a single mask.

The overlap between the metal 1 portions and the dummy polysilicon layers, such as at 77 in the figure, should preferably be controlled to minimize capacitance that might otherwise occur between metal 1 and the underlying dummy polysilicon portions. The importance of having a variable layer to cell boundary spacing rule is that when the metal 1 layer can extend to one side of the cell boundary, the logic circuit formed in the cells may be completed using only metal 1 and polysilicon. The adjacent cell must have a layer to cell boundary spacing of a" to maintain the layer to layer spacing distance "a" as explained above.

Additional embodiments include the use of compressive stress to improve the performance of the P MOS devices. As is known in the art, if same sized N and P type transistors are formed in a CMOS process, the P type transistors tend to have less performance than the N type transistors. Typically, this may be compensated for by increasing the size or doping concentrations of the P type transistors. Recently, it has been found that putting compressive stress on the P type transistor region can enhance carrier mobility and thus increase performance. In FIG. 7, the double etch stop layer (DESL) which is used to control etch processing of certain layers is also used to compressively stress the P diffusion area for the P type MOS transistors P1 and P2, and thereby enhance the performance of the finished circuits. Of course, this step may be omitted in an alternative embodiment.

The relationship between the layer to layer boundaries of adjacent cells is maintained by the method, for example by using EDA placement tools, so that the full layer to layer required spacing 'a' is always maintained. The use of the variable layer to cell boundary spacing of the invention greatly relieves the area penalty the prior art solutions imposed on the design when using RDRs. Also, by eliminating some of the metal 2 and metal 3 layers in the stated cell area, the circuits implemented within the standard cells have lower layer to layer capacitance, which increases switching speed of the circuitry.

Figure 4:
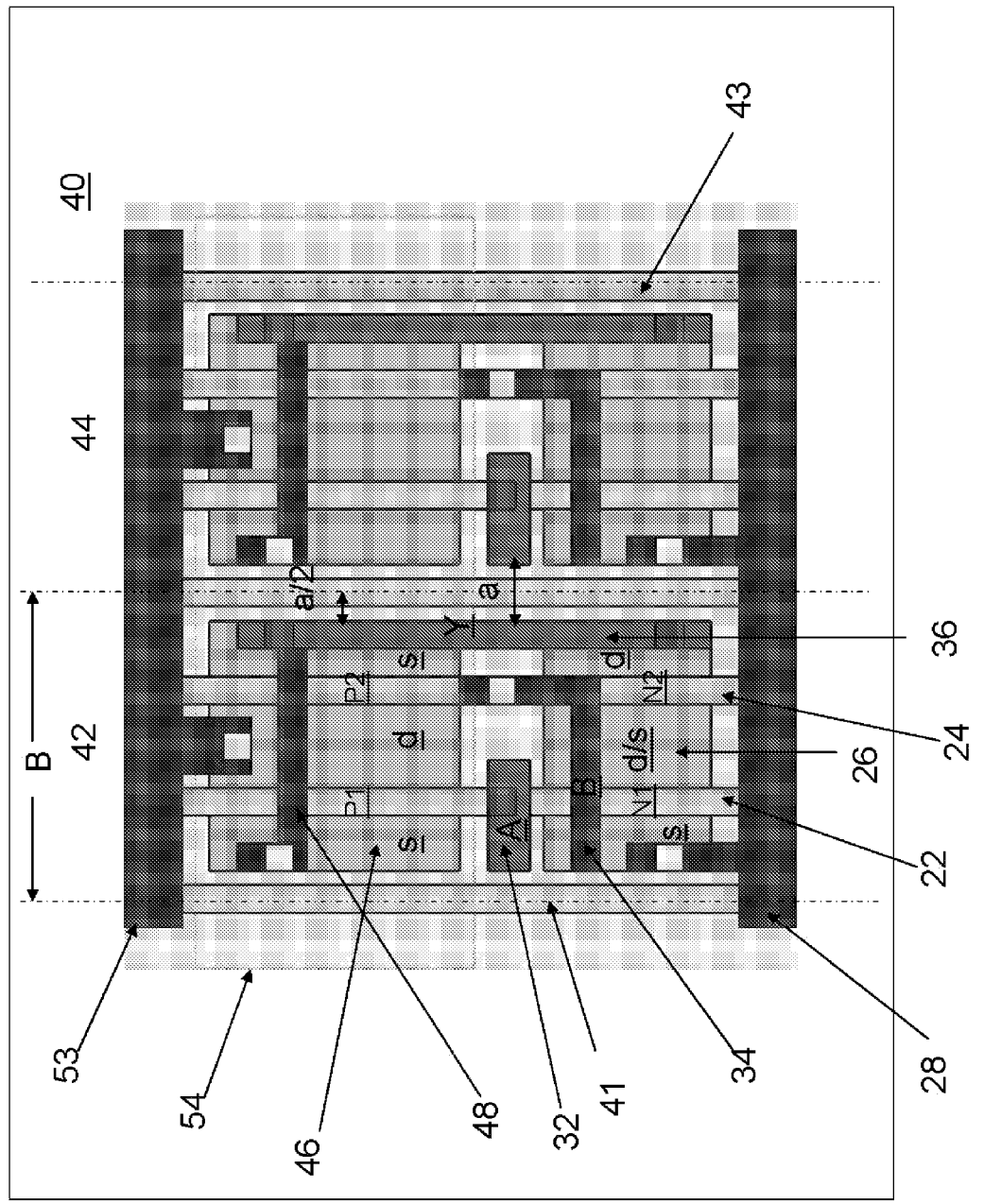
FIG. 4 illustrates in a plan view the standard cell layout that is obtained for the two input NAND gate of FIG. 3 using the prior art layout design and layer to layer spacing rules.

In an example implementation using standard 32 nanometer processing parameters, a plurality of standard cells was placed and connected to form a 32 inverter oscillator. The first set of inverters was laid out as in FIG. 4 using RDRs and the metal 2 in the cells to connect (prior art approach). In another implementation, contact reduction techniques were applied to the layout and 60% contact size was used. In a preferred embodiment, the novel variable layer to cell boundary rules of the invention were applied to the standard cell layouts, as in FIG. 7, along with the reduced area contact sizes.

The resulting performance comparison is presented in FIG. 8. In FIG. 8, the top row illustrates the simulation results for the three inverter chains. The prior art approach, labeled "Original Layout", has a Rise Time, Fall Time, Frequency and Power data point. In the middle row, this is compared to the prior art approach with a reduction in contact size. This increases the speed of the inverter chain operation but power is not changed. In the third row of the table, a chain of inverters is implemented using the preferred layout embodiments with variable spacing rules of the present invention to further improve the layout. The frequency is increased over the original prior art approach by 9.55%, while at the same time, the power consumed is reduced by approximately the same percentage. Thus, the use of the embodiments of the invention has advantages in speed, power and silicon area required.

The increase in performance is believed to be due to shifting the power rails for VDD and VSS to metal 2, from metal 3 layers in the prior art, reducing capacitance. Also, the output contact capacitance is reduced as the output is now a metal 1 layer portion, and metal 2 is not present within the standard cell interior.

Further benefits of the use of the embodiments of the invention are that aligning all the polysilicon in one direction minimizes polysilicon to polysilicon spacing impacts. The prior art layout has an L shaped OD (active area) which creates some additional process variation sensitivity. The preferred embodiment standard cell has rectangular OD areas that reduce these problems.

The device performance is further increased in preferred embodiments by the use of a wider DESL and N-Well layer enclosure. The dummy polysilicon layers are available for vertical interconnect. In a preferred integrated circuit layout using the standard cells, dummy polysilicon is aligned and placed in the vertical directions and between rows of cells in the horizontal and vertical directions, to isolate external layout effect impacts.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An integrated circuit structure, comprising:
a first cell area defined in a semiconductor substrate extending in a first direction and a second direction and having a cell boundary, the first cell area comprising:
a first active region;
at least one first gate electrode strip overlying the first active region and aligned in the first direction;
a first set of lines of a conductor layer having at least two portions and having a minimum spacing distance between the two portions;
one of the portions of the first set of lines having a first spacing distance to the cell boundary, wherein the first spacing distance is substantially less than half of the minimum spacing distance; and
a second cell area defined in the semiconductor substrate extending in the first direction and a second direction and having a common cell boundary in the first direction with the first cell, the second cell area comprising:
a second active region;
at least one second gate electrode strip overlying the second active region and aligned in the first direction;
a second set of lines of the conductor layer having at least two portions and having the minimum spacing distance between the two portions; and
one of the portions of the second set of lines being disposed and spaced from the common cell boundary by a second spacing distance and being disposed adjacent the one portion of the first set of lines in the first cell, the second spacing distance being substantially greater than half of the minimum spacing distance.

2. The integrated circuit structure of claim 1, and further comprising:
dummy gate electrode strips disposed in the first and second cell areas and aligned in the first direction and substantially in parallel to the first and second gate electrode strips.

3. The integrated circuit structure of claim 1, and further comprising:
a third active region in the first cell area, the first and third active regions being doped semiconductor material of opposite conductivity types.

4. The integrated circuit of claim 1, wherein the sum of the first spacing distance and the second spacing distance is a distance greater than or equal to the minimum spacing distance.

5. The integrated circuit structure of claim 1, wherein the first and second gate electrode strips comprise polysilicon disposed over a dielectric material.

6. The integrated circuit structure of claim 3, wherein the first gate electrode strips and the first and third active regions form MOS transistor structures in the first and third active regions.

7. The integrated circuit structure of claim 6, wherein the first and third active regions and the first gate electrode strip form a first P MOS transistor and a first N MOS transistor.

8. The integrated circuit structure of claim 7, wherein the first P MOS transistor and first N MOS transistor have a common gate terminal.

9. An integrated circuit, comprising:
an embedded logic function formed in a semiconductor substrate defining a portion of the integrated circuit; and
a plurality of standard cells formed in the semiconductor substrate and defining another portion of the integrated circuit, implementing user specified functions, the plurality of standard cells comprising:
at least one first standard cell formed in the semiconductor substrate and comprising:
a first active area of a first conductivity type;
a second active area of a second conductivity type;
a cell boundary extending in a first direction and a second direction surrounding the first and second active areas;
at least one gate electrode strip formed over the first and second active areas and aligned in the first direction and having a uniform pitch;
at least one dummy gate electrode strip formed along the cell boundaries and aligned in the first direction and having the uniform pitch;
a plurality of conductors formed in a conductive layer overlying the first standard cell, the plurality of conductors having portions spaced apart one from another by a minimum spacing distance; and
at least one of the plurality of conductors formed in the conductive layer having a portion spaced from a cell boundary by a distance that is substantially less than the minimum spacing distance, the portion partially overlying a dummy gate electrode strip; at least one second standard cell formed in the semiconductor substrate and comprising:
a third active area of a first conductivity type;
a fourth active area of a second conductivity type;
a second cell boundary extending in the first direction and a second direction surrounding the first and second active areas and having a common cell boundary with the first standard cell;
at least one second gate electrode strip formed over the third and fourth active areas and aligned in the first direction and having the uniform pitch;
at least one second dummy gate electrode strip formed along the cell boundaries of the second cell and aligned in the first direction and having the uniform pitch;
a second plurality of conductors formed in the conductive layer overlying the second standard cell, the second plurality of conductors having portions spaced apart one from another by the minimum spacing distance; and
at least one of the second plurality of conductors formed in the conductive layer having a portion spaced from the common cell boundary by a distance that is substantially greater than the minimum spacing distance, and adjacent the at least one portion of the plurality of conductors from the first cell;
wherein the sum of the first spacing distance and the second spacing distance is at least equal to the minimum spacing distance.

10. The integrated circuit of claim 9, wherein the first and second active areas in the first standard cell and the at least one gate electrode strip form at least a P MOS and an N MOS transistor.

11. The integrated circuit of claim 10, wherein the gate electrode strips further comprise a polysilicon gate electrode and a dielectric material overlying the first, second, third and fourth active areas.

12. The integrated circuit of claim 9, wherein for each of the plurality of standard cells, the gate electrode strips and the dummy electrode strips are of a uniform width and a uniform pitch.

13. The integrated circuit of claim 12, wherein a portion of each of the first active areas in the plurality of standard cells has a dual etch stop layer of dielectrics overlying the first active area to provide compressive strain.

14. The integrated circuit of claim 10, wherein the plurality of conductors in a conductive layer comprise a first metal layer.

15. The integrated circuit of claim 14, wherein the metal layer is one selected from the group of copper and its alloys, and aluminum and its alloys.

* * * * *